(12) United States Patent
Takaoka et al.

(10) Patent No.: US 7,278,299 B2
(45) Date of Patent: Oct. 9, 2007

(54) METHOD OF PROCESSING VERTICAL CROSS-SECTION USING ATOMIC FORCE MICROSCOPE

(75) Inventors: Osamu Takaoka, Chiba (JP); Masatoshi Yasutake, Chiba (JP); Shigeru Wakiyama, Chiba (JP); Naoya Watanabe, Chiba (JP)

(73) Assignee: SII NanoTechnology Inc. (JP)

( * ) Notice: Subject to any disclaimer, the term of this patent is extended or adjusted under 35 U.S.C. 154(b) by 317 days.

(21) Appl. No.: 11/135,075

(22) Filed: May 23, 2005

(65) Prior Publication Data

US 2005/0262685 A1     Dec. 1, 2005

(30) Foreign Application Priority Data

May 24, 2004   (JP) .............................. 2004-153696

(51) Int. Cl.
*G01B 5/28* (2006.01)
*B23Q 17/00* (2006.01)

(52) U.S. Cl. .................. 73/105; 250/306; 250/307; 250/442.11; 29/407.5; 29/426.5; 29/426.6; 73/104

(58) Field of Classification Search ................ 250/309, 250/310; 73/104, 105
See application file for complete search history.

(56) References Cited

U.S. PATENT DOCUMENTS

| | | | | |
|---|---|---|---|---|
| 5,193,383 A | * | 3/1993 | Burnham et al. ............. | 73/105 |
| 5,700,953 A | * | 12/1997 | Hlady et al. .................. | 73/105 |
| 5,847,270 A | * | 12/1998 | Nettleton ..................... | 73/105 |
| 6,000,281 A | * | 12/1999 | Burke ........................ | 73/105 |
| 6,185,991 B1 | * | 2/2001 | Hong et al. ................... | 73/105 |
| 6,755,075 B2 | * | 6/2004 | Nagashima et al. .......... | 73/105 |
| 6,809,306 B2 | * | 10/2004 | Ando et al. ............... | 250/201.3 |
| 6,864,481 B2 | * | 3/2005 | Kaito et al. ................. | 250/306 |
| 7,053,369 B1 | * | 5/2006 | Roessler et al. ............ | 250/306 |
| 2003/0070475 A1 | * | 4/2003 | Nagashima et al. ........... | 73/81 |
| 2005/0081608 A1 | * | 4/2005 | Shoelson ..................... | 73/105 |
| 2005/0247874 A1 | * | 11/2005 | Ando et al. ................. | 250/306 |
| 2005/0262685 A1 | * | 12/2005 | Takaoka et al. .............. | 29/593 |
| 2005/0285033 A1 | * | 12/2005 | Takaoka et al. ............. | 250/309 |
| 2006/0108523 A1 | * | 5/2006 | Ue .............................. | 250/309 |
| 2006/0174384 A1 | * | 8/2006 | Roessler et al. ............ | 977/863 |

\* cited by examiner

*Primary Examiner*—Robert Kim
*Assistant Examiner*—Bernard Souw
(74) *Attorney, Agent, or Firm*—Adams & Wilks

(57) ABSTRACT

An indentation is formed by thrusting a probe of a scanning probe microscope for processing, which has a vertical surface or a vertical ridge and is harder than sample material, into sample for measuring the indentation. A high-fidelity AFM observation is performed on the shape of the formed indentation with a thin probe with high aspect ratio, the direction of the vertical surface or the vertical ridge is inspected, and the angle error $\theta$ is stored. By rotating a sample stage by an angle corresponding to the measured mounting angle error $\theta$ of the probe, the mounting angle error of the probe is corrected in advance.

5 Claims, 4 Drawing Sheets

ROTATION OF STAGE/CORRECTION OF POSITIONAL DISPLACEMENT

ROTATION OF STAGE/CORRECTION OF POSITIONAL DISPLACEMENT

ROTATION OF STAGE/CORRECTION OF POSITIONAL DISPLACEMENT

ROTATION OF STAGE/CORRECTION
OF POSITIONAL DISPLACEMENT

ROTATION OF STAGE/CORRECTION
OF POSITIONAL DISPLACEMENT

TOP VIEW  CROSS-SECTIONAL VIEW

TOP VIEW  CROSS-SECTIONAL VIEW

METHOD OF PROCESSING VERTICAL CROSS-SECTION USING ATOMIC FORCE MICROSCOPE

BACKGROUND OF THE INVENTION

The present invention relates to a method of micro-processing of a nanometer level in which an atomic force microscopic technology is applied.

A micro-processing technology in a nanometer order is required for improvement of level and degree of integration of functions, and research and development regarding processing technologies such as local anodic oxidation or fine scratch processing using a scanning probe microscope (SPM) have been extensively carried out. Not only pursuit of possibility of micro-processing, but also an accurate shape or processing with high degree of accuracy is now increasingly required.

Recently, for example, correction of excessive-pattern defect of a photomask is performed by a fine scratch processing, in which processing is performed by scanning with a strong pushing force applied to a probe which is harder than material to be processed to achieve physical removal using a device based on an atomic force microscope (AFM) (for example, Y. Morikawa, H. Kokubo, M. Nishiguchi, N. Hayashi, R. White R. Bozak, and L. Terrill. Proc. of SPIE 5130 520-527(2003)). In order to correct the defect of the photomask, it is required not only that the fine defect is corrected with high degree of accuracy, but also that the position to be corrected has the same optical properties as the normal pattern and hence has the vertical cross-section same as the normal pattern.

In order to obtain the vertical cross-section by the AFM scratch processing, cutting is performed using a probe having a vertical cross-section. In this case, it is necessary to align the desired direction of vertical cross-section and the vertical cross-section of the probe. However, even when it is expected to be aligned as long as design is concerned, it is difficult to align them exactly due to the angle error at the time of mounting the probe and the angle error at the time of fixing a mask. When there are two or more desired directions of the vertical cross-section, the mask must be removed, rotated, and fixed again. After having re-fixed the mask, the position to be processed must be performed again from the beginning.

According to the method described. above, when there are two or more desired directions of vertical cross-section, a throughput of processing is significantly lowered. There is also a problem such that the processed shape is not necessarily the vertical cross-section due to the angle displacement of the vertical cross-section of the probe and due to the angle displacement of a sample.

SUMMARY OF THE INVENTION

The object of the present invention is to obtain a vertical processed surface by mechanical processing using an atomic force microscopic technology in a reliable and simple manner in comparison with the related art.

An indentation is formed on a sample for measuring the indentation by thrusting a processing probe of a scanning probe microscope, which is harder than a sample material and is provided with a vertical surface or a vertical ridge. A high-fidelity AFM observation is performed on the formed shape of indentation with a thin probe with high aspect ratio, and the direction of the vertical surface or the vertical ridge is inspected to record the angle error. When there is rotational displacement in mounting of a mask or printing of a pattern, the pattern on the mask which should be horizontal is observed, and correction by the corresponding amount is made by a rotary stage. A position to be processed is observed by the AFM, and the angle of the direction at which the vertical cross-section is required is obtained. Then, the rotary stage is rotated by an angle obtained by summing the angle of the probe, the rotational displacement of the mask mounting or pattern printing, and the direction at which the vertical cross-section is required so that the vertical surface or the vertical ridge of the probe matches the direction at which the vertical cross-section is required. The probe is moved to the position to be processed, and scanned along the vertical cross-section of the probe in a state in which the vertical surface or the vertical ridge of the probe is faced in the required direction to perform the processing of the vertical cross-section by physical removal with the hard probe.

When it is necessary to fabricate the pattern at a position set back with respect to the normal pattern, the stage is rotated so that the vertical surface of the probe forms a cutting angle of about predetermined several degrees with respect to the pattern, then the positional displacement is corrected, and then the processing of the vertical cross-section is performed. The processing of the vertical cross-section can also be performed by rotating an entire scanning unit of the atomic force microscope instead of rotating the stage for adjustment of the angle between the vertical surface of the probe of the atomic force microscope and the pattern to be processed.

Advantages

Since the mounting angle error of the vertical surface or the vertical ridge of the probe is measured from the indentation in advance before processing and the mounting angle displacement of the sample can be obtained by AFM measuring of the sample, both rotational errors are corrected by the rotary stage, and hence vertical cross-section can be formed in the desired direction.

Also when processing with the vertical surface of the probe, the processing can be made at a position set back with respect to the pattern by rotating a cutting edge by about several degrees. When the line width of a transmitted beam is narrowed when cutting is made in the same manner as the pattern, by processing at a position set back with respect to the pattern, the line width of the transmitted beam can be equalized with the normal pattern.

DETAILED DESCRIPTION OF THE INVENTION

An embodiment in which the present invention is applied to removal of an excessive-pattern defect of a photomask will be described.

Figure 1A:
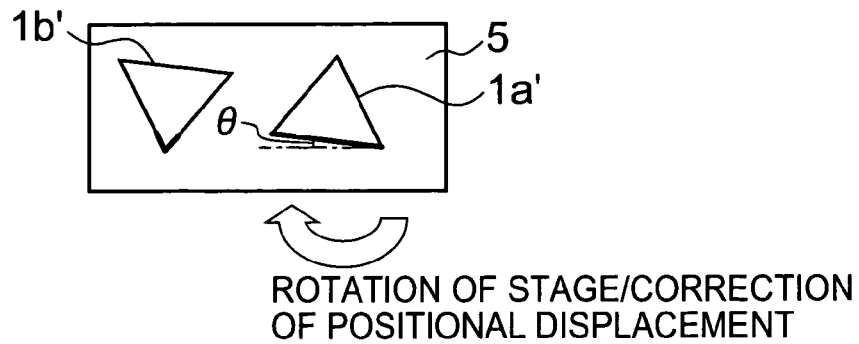
FIGS. 1A-1B are top views showing a case in which displacement of a mounting angle of a processing probe is corrected by a rotary stage, showing a characteristic of the present invention in the most understandable manner.
Figure 1B:
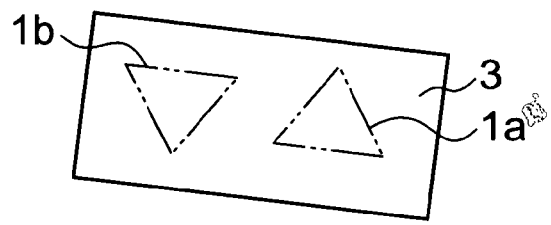

FIGS. 1A-1B are top views of a sample for explaining a case in which a mounting angle error of a processing probe of an AFM is corrected by a rotary stage.

As shown in FIG. 1A, an AFM probe 1a (or 1b) formed of diamond having a vertical surface or a vertical ridge with respect to a surface of an indentation-measurement sample 5 is thrust in the indentation-measuring sample 5 to form indentations 1a', 1b'. A high-fidelity AFM observation is performed on the shape of formed indentation with a probe with a small distal diameter and high aspect ratio, such as a carbon nanotube, and the direction of the vertical surface or the vertical ridge is inspected to measure an angle error θ with respect to the direction of scanning of the probe. In this case, as shown in FIG. 1A, the indentation corresponding to the vertical surface of the probe 1a is displaced by the angle θ with respect to the direction of scanning of the probe. Therefore, by rotating a sample stage by the angle θ, the vertical surface or the vertical ridge of 1a', 1b' are brought into the direction parallel with the direction of scanning, as shown in FIG. 1B. In this state, the mounting error of the probe is corrected. Here, the probes 1a, 1b are shown by phantom lines in cross-section in the direction parallel to the sample surface. The probes 1a, 1b are formed into a triangular pyramid having an apex at the distal end thereof.

Figure 2A:
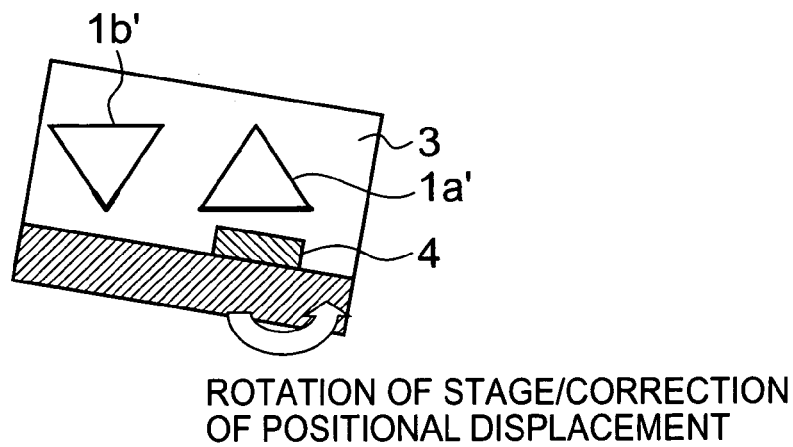
FIGS. 2A-2B are explanatory top views showing a case in which a rotational displacement in mounting or transfer of a mask is corrected by the rotary stage.
Figure 2B:
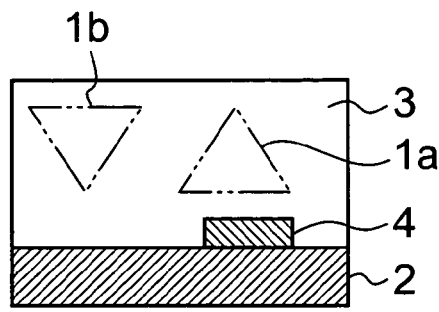
Figure 3A:
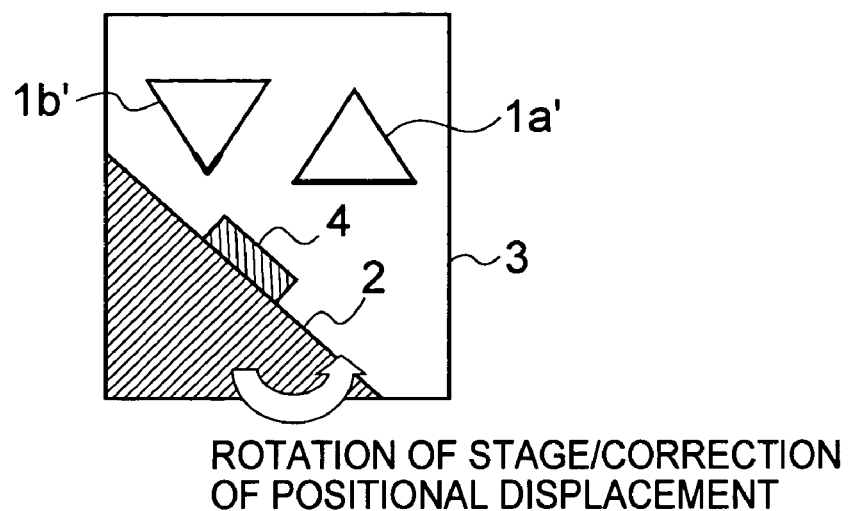
FIGS. 3A-3B are explanatory plan views showing a case in which the angle displacement is corrected by the rotary stage when a pattern to be corrected differs from a scanning direction.
Figure 3B:
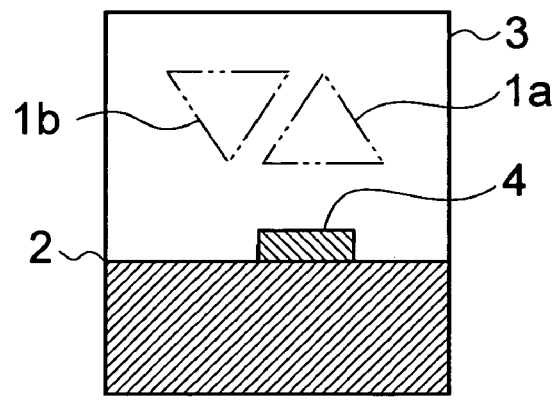
Figure 6A:
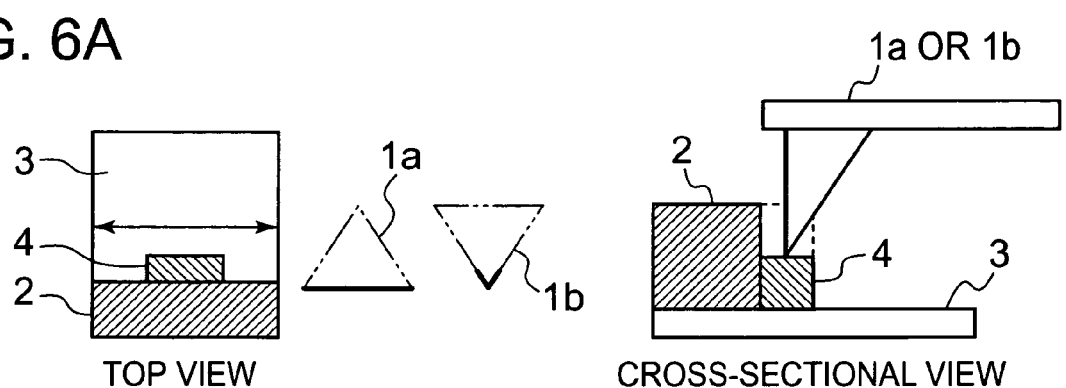
FIGS. 6A-6B are cross-sectional views showing a method of removing the excessive-pattern defect by the probe.
Figure 6B:
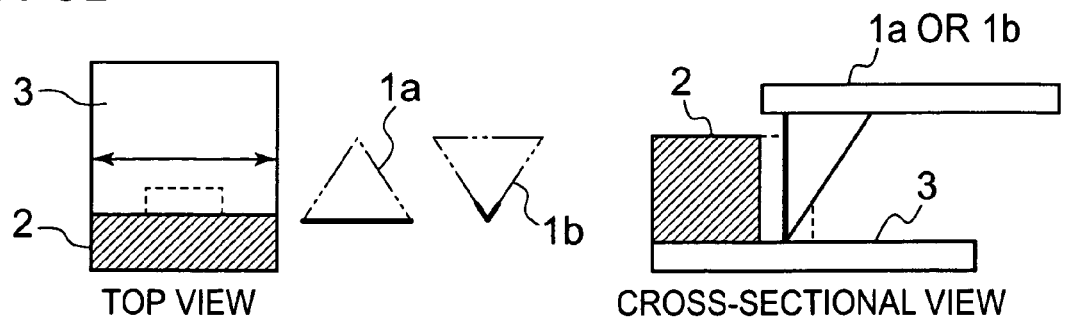

Then, the photomask on which the excessive-pattern defect is found by a defect inspection device is introduced into the present AFM device, and the stage is moved to the position where the excessive-pattern defect 4 is found. As shown in FIGS. 2A-2B, when there is rotational displacement in mounting of the mask or printing of the pattern, the pattern on the mask which should be horizontal is observed, and correction by the corresponding amount is made by the rotary stage. In other words in FIG. 2A, the indentation 1a' or 1b' is formed on a glass substrate 3 (or the patterned portion), the angle formed with respect to a shielding layer pattern 2 (hereinafter referred to as pattern 2) is measured, and the sample stage is rotated by the measured angle so that the pattern 2 takes a correct position with respect to the vertical surface or the vertical ridge of the probe 1a (or 1b) as shown in FIG. 2B. Subsequently, as shown in FIGS. 6A, 6B, the probe 1a (or 1b) is scanned in the direction in parallel with the pattern 2 to cut off the excessive-pattern defect 4. As shown in FIGS. 3A-3B, when the pattern 2 does not take the correct position with respect to the vertical surface or the vertical ridge of the probe 1a (or 1b), the angle with respect to the portion corresponding to the vertical surface of the indentation 1a' and the vertical ridge of 1b' of the pattern 2 is obtained. In other words, according to the indentation, the sample stage is rotated by an angle obtained by summing the mounting angle error of the probe 1a (or 1b) measured by the indentation sample and the angle of the pattern 2 including the excessive-pattern defect 4 so that the vertical surface or the vertical ridge of the probe 1a (or 1b) takes the correct position with respect to the pattern 2 having the excessive-pattern defect 4 as shown in FIG. 3B. Since the position of observation in the XY directions is shifted by the rotation, the position is corrected in the XY stage to the position where the excessive-pattern defect 4 is found, and the area including the excessive-pattern defect 4 is observed by bringing the probe into contact at a low load. Then, in a state in which the vertical surface of the probe 1a or the vertical ridge of the probe 1b takes the correct position with respect to the pattern 2 having the excessive-pattern defect 4, the probe 1a (or 1b) is scanned at a high load along the vertical surface of the probe 1a or the vertical ridge of the probe 1b to perform the processing by the physical removal using the hard diamond probe. The AFM observation at a low load and the processing at a high load are repeated until the excessive-pattern defect can be removed with high degree of accuracy.

Figure 4A:
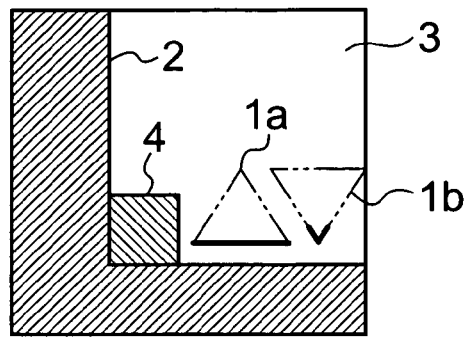
FIGS. 4A-4D are explanatory top views showing a method of correction when two or more surfaces of an excessive-pattern defect come into contact with a normal pattern.
Figure 4B:
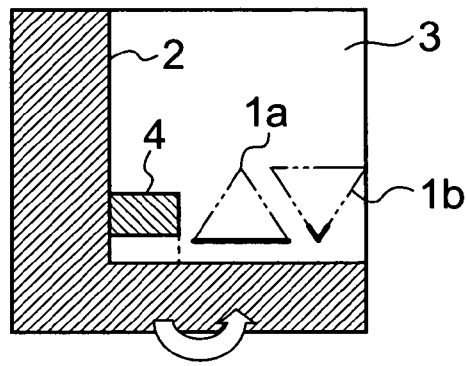
Figure 4C:
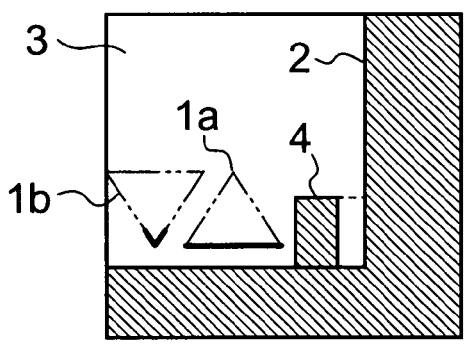
Figure 4D:
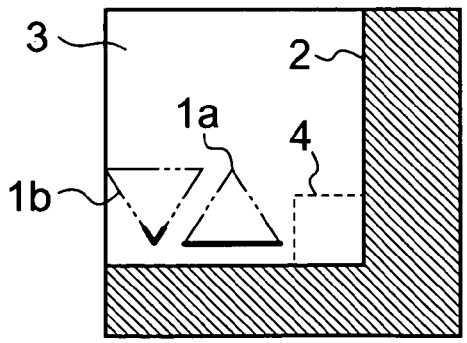

When two or more surfaces of the excessive-pattern defect 4 are in contact with the pattern 2, as shown in FIGS. 4A-4B, the vertical surface or the vertical ridge of the probe 1a (or 1b) is brought into the correct position with respect to one surface first to remove the excessive-pattern defect 4 as shown in FIG. 4A. FIG. 4B shows the inside part of defect 4 was removed by probe 1a or 1b that was scanned in the parallel direction to the horizontal pattern. Then, the stage is rotated to bring the vertical surface or the vertical ridge of the probe 1 into the correct position with respect to another surface and remove the excessive-pattern defect as shown in FIG. 4C. At this time, since the position of observation is displaced by the rotation, the position is adjusted by moving the sample in parallel and the position of the probe is aligned with respect to the position where the excessive-pattern defect 4 is found. FIG. 4D shows that the entire defect 4 was removed by the probe. When three or more surfaces are in contact with the pattern 2, the stage is further rotated and the remaining surface is also processed in the same manner. When there are the plurality of excessive-pattern defects 4 on one mask, the first defect is corrected, then after having moved to a second defect, the AFM observation of the portion where the correction of the defect is necessary is performed, and then the angle with respect to the pattern having the excessive-pattern defects 4 corresponding to the vertical surface or the vertical ridge of the indentation is obtained. At this time, the stage is rotated only by the above-described angle of the pattern having the excessive-pattern defects 4. Since the position of observation is displaced in the XY directions by this rotation, the position is adjusted by moving the sample in parallel and the position of the probe is aligned with respect to the position where the excessive-pattern defect is found. Processing is performed in the same manner as a first defect correction. When there are three or more excessive-pattern defects, the procedure for a second defect correction is repeated until all the excessive-pattern defects 4 are removed on the mask.

It is necessary to replace the diamond probe 1a (or 1b) for processing since it is subjected to abrasion while processing is repeated, and hence it cannot be used any more for micro-processing. When changing the probe, since the mounting angle of the probe 1a (or 1b) varies, the indentation is formed by thrusting the replaced AFM processing probe 1a (or 1b) formed of diamond into the sample for indentation measurement. The high-fidelity AFM observation is performed on the shape of the formed indentation with a thin probe with high aspect ratio, the direction of the vertical surface or the vertical ridge is inspected as shown in FIG. 1(a) again to measure the angle error θ to renew data on angle error. Using the renewed angle error data, the excessive-pattern defect is removed and corrected in the same manner as described above.

Figure 5A:
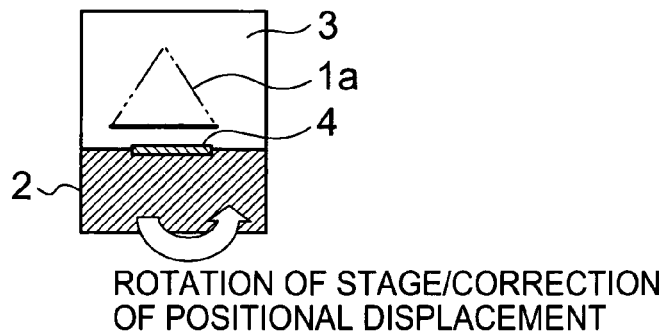
FIGS. 5A-5B are explanatory top views showing a case in which processing is performed at a cutting angle with respect to the pattern by means of the rotary stage when it is necessary to fabricate the pattern at a position set back with respect to the normal pattern.
Figure 5B:
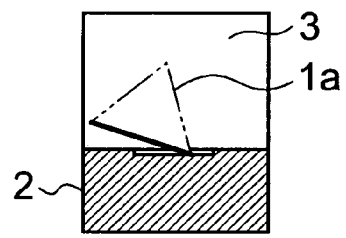

When correction is necessary to be set back with respect to the normal pattern in order to bring in the coefficient of transmission, as shown in FIG. 5A, the stage is rotated so that the vertical surface or the vertical ridge of the probe 1a (or 1b) forms a predetermined cutting angle of about several degrees with respect to the pattern, and then the correction of displacement is performed to achieve processing of the vertical cross-section as shown in FIG. 5B.

Although the angle alignment between the vertical surface or the vertical ridge of the probe 1a (or 1b) of the atomic force microscope and the pattern which required a vertical cross-section is achieved by the rotation of the stage in the above-described embodiment, when the atomic force microscope which scans with a voice coil motor using a self-detection probe is employed, the processing of the vertical cross-section as described above can be achieved also by rotating the entire scanning unit of the probe instead of the stage, and correcting the displacement of the position of observation due to the rotation by the XY stage.

What is claimed is:

1. A method of processing vertical cross-section using an atomic force microscope (hereinafter, referred to as AFM) comprising the steps of:
   thrusting an AFM probe having a vertical surface or a vertical ridge with respect to a sample surface into a sample for measuring an indentation, which is more flexible than material of the AFM probe to form the indentation;
   observing the shape of the indentation with the AFM;
   measuring a mounting angle error of the probe, which corresponds to the angle displacement of the vertical surface or the vertical ridge with respect to a scanning direction of the probe, from the shape of the indentation;
   correcting the mounting angle error of the probe in advance by rotating a sample stage or an entire scanning unit of the atomic force microscope by an angle corresponding to the measured mounting angle error of the probe;
   placing the sample so that the vertical cross-section of the pattern of the sample to be fabricated is oriented in parallel with a scanning direction of the atomic force microscope; and
   processing the vertical cross-section of the pattern.

2. A method of processing vertical cross-section using an atomic force microscope according to claim 1, wherein after having formed the indentation on the sample to be processed with the probe, and when a portion of the indentation formed by the vertical ridge or the vertical surface of the probe does not take a correct position with respect to the vertical cross-section of the pattern of the sample to be processed due to the rotational error occurred when mounting the sample, the processing of the vertical cross-section is achieved by obtaining the angle between the pattern and the portion of indentation, and rotating the sample stage or an entire scanning unit of the atomic force microscope by the obtained angle so that the vertical cross-section of the pattern takes the correct position with respect to the probe.

3. A method of processing vertical cross-section using an atomic force microscope according to claim 1, wherein the angle between the pattern and the portion of the indentation is obtained, and the sample stage or an entire scanning unit of the atomic force microscope is rotated by the obtained angle to bring the vertical cross-section of the pattern to take the correct position with respect to the probe to achieve alignment, and then the processing of the vertical cross-section is performed.

4. A method of processing vertical cross-section using an atomic force microscope according to claim 1, wherein when processing is necessary to be set back with respect to a normal pattern, the stage or the entire scanning unit of the atomic force microscope is rotated so that the vertical surface of the probe forms a predetermined cutting angle of about several degrees with respect to the pattern, then correction of a positional displacement in XY directions is performed, and then the processing of the vertical cross-section is performed.

5. A method of processing vertical cross-section using an atomic force microscope (hereinafter, referred to as AFM) comprising the steps of:
   thrusting an AFM probe having a vertical surface or a vertical ridge with respect to a sample surface into a sample to be processed to form the indentation;
   observing a portion of the indentation with the AFM; and
   processing the vertical cross-section achieved by obtaining the angle between the pattern and the indentation, rotating a sample stage by the obtained angle so that the vertical cross-section of the pattern takes the correct position with respect to the probe when the portion of the indentation formed by the vertical ridge or the vertical surface of the probe does not take a correct position with respect to the vertical cross-section of the pattern of the sample to be processed.

* * * * *